United States Patent

Mizunashi

(10) Patent No.: US 11,208,532 B2
(45) Date of Patent: Dec. 28, 2021

(54) ADDITION-CURABLE SILICONE RESIN COMPOSITION AND A SEMICONDUCTOR DEVICE

(71) Applicant: Shin-Etsu Chemical Co., Ltd., Tokyo (JP)

(72) Inventor: Tomoyuki Mizunashi, Annaka (JP)

(73) Assignee: SHIN-ETSU CHEMICAL CO., LTD., Toyko (JP)

( * ) Notice: Subject to any disclaimer, the term of this patent is extended or adjusted under 35 U.S.C. 154(b) by 0 days.

(21) Appl. No.: 16/527,444

(22) Filed: Jul. 31, 2019

(65) Prior Publication Data

US 2020/0040138 A1 Feb. 6, 2020

(30) Foreign Application Priority Data

Jul. 31, 2018 (JP) .............................. JP2018-143326

(51) Int. Cl.
| | | |
|---|---|---|
| *C08G 77/12* | (2006.01) | |
| *C08G 77/08* | (2006.01) | |
| *C08L 83/04* | (2006.01) | |
| *H01L 33/56* | (2010.01) | |
| *C08G 77/00* | (2006.01) | |

(52) U.S. Cl.
CPC ............ *C08G 77/12* (2013.01); *C08G 77/08* (2013.01); *C08G 77/80* (2013.01); *C08L 83/04* (2013.01); *H01L 33/56* (2013.01); *C08L 2203/206* (2013.01)

(58) Field of Classification Search
CPC ......... C08L 83/00; C08G 77/12; C08G 77/20; C08G 77/80; C08G 77/16; C08G 77/18; C08G 77/70; H01L 33/56; H01L 23/296
See application file for complete search history.

(56) References Cited

U.S. PATENT DOCUMENTS

| | | | |
|---|---|---|---|
| 6,417,310 B1 | 7/2002 | Omura et al. | |
| 2006/0135687 A1* | 6/2006 | Fukui | ............ C08L 83/04 524/588 |
| 2007/0244214 A1 | 10/2007 | Yoshitake et al. | |
| 2008/0070333 A1 | 3/2008 | Morita et al. | |
| 2009/0236759 A1 | 9/2009 | Kashiwagi | |
| 2011/0269918 A1 | 11/2011 | Hamamoto | |
| 2013/0082369 A1 | 4/2013 | Kukubo et al. | |
| 2014/0024796 A1* | 1/2014 | Mizunashi | ............ G02B 1/041 528/31 |
| 2015/0188008 A1 | 7/2015 | Kokubo et al. | |
| 2016/0304673 A1 | 10/2016 | Kusunoki et al. | |
| 2017/0114220 A1* | 4/2017 | Kusunoki | ............ H01L 33/507 |

FOREIGN PATENT DOCUMENTS

| | | |
|---|---|---|
| JP | 2001 163981 A | 6/2001 |
| JP | 2000 351949 A | 12/2002 |
| JP | 2002 348377 A | 12/2002 |
| JP | 2003-423726 | 7/2005 |
| JP | 2006 093354 A | 4/2006 |
| JP | 2009 256603 A | 11/2009 |
| JP | 2013 079328 A | 5/2013 |
| JP | 5844252 B2 | 1/2016 |
| JP | 2016 204426 A | 12/2016 |

OTHER PUBLICATIONS

Freeman (Silicones, Published for the Plastics Institute, ILIFFE Books Ltd., 1962).*
European Search Report, dated Dec. 12, 2019.

* cited by examiner

*Primary Examiner* — Kuo Liang Peng
(74) *Attorney, Agent, or Firm* — Rimon, P.C.

(57) ABSTRACT

An addition-curable silicone resin composition which exhibits good adhesion to a substrate and has good compatibility with an inorganic filler, as well as a cured product thereof and a highly reliable semiconductor device encapsulated with the cured product, are provided. The addition-curable silicone resin composition includes (A) a linear or branched organopolysiloxane having at least one alkenyl group, said organopolysiloxane comprising at least one unit selected from $R^1R^2SiO_{2/2}$ and $R^1R^2{}_2SiO_{1/2}$ units, and at least one unit selected from $R^{2'}{}_2SiO_{2/2}$, $R^{2'}{}_3SiO_{1/2}$ and $R^{2'}SiO_{3/2}$ units, wherein a percentage of a total number of the $R^1R^2SiO_{2/2}$ and $R^1R^2{}_2SiO_{1/2}$ units, relative to a total number of all siloxane units, is from 0.001% to 50%, and wherein $R^1$ is, independently at each occurrence, a hydroxy group or an alkoxy group of 1 to 30 carbon atoms; $R^2$ is, independently at each occurrence, a group selected from a substituted or unsubstituted saturated hydrocarbon group of 1 to 12 carbon atoms, a substituted or unsubstituted aromatic hydrocarbon group of 6 to 12 carbon atoms, an alkenyl group of 2 to 10 carbon atoms, and the groups as defined for $R^1$; and $R^{2'}$ is a groups selected from the groups as defined for $R^2$ other than those as defined for $R^1$, with the proviso that at least one of $R^2$ and $R^{2'}$ is an alkenyl group; (B) an organohydrogenpolysiloxane having at least two hydrosilyl groups, in an amount such that the ratio of the number of hydrosilyl groups in component (B) to a total number of alkenyl groups in component (A) is from 0.1 to 4; and (C) a catalytic amount of a hydrosilylation catalyst.

7 Claims, No Drawings

ADDITION-CURABLE SILICONE RESIN COMPOSITION AND A SEMICONDUCTOR DEVICE

CROSS-REFERENCE TO RELATED APPLICATION

This application claims priority to and the benefit of Japanese Patent Application No. 2018-143326 filed on Jul. 31, 2018, the contents of which are hereby incorporated by reference.

FIELD OF THE INVENTION

The present invention relates to an addition-curable silicone resin composition, and a semiconductor device comprising a semiconductor element encapsulated with a cured product of the composition.

Addition-curable silicone resins are conventionally used as an encapsulant for semiconductor elements such as light emitting diodes (LED), on account of their excellent heat resistance and light resistance and fast curability. For example, JP 2009-256603A discloses an addition-curable silicone composition which exhibits high adhesive strength to an LED package made of a thermoplastic resin such as polyphthalamide (PPA). JP 2006-093354A discloses a method of encapsulating an optical semiconductor device by compression molding of an addition-curable silicone resin composition.

As described above, addition-curable silicone resins are widely used as materials for encapsulating semiconductor elements, but their properties are still unsatisfactory. In particular, for LED-encapsulating materials which are exposed to external stresses such as changes in the atmospheric temperature and humidity in addition to internal stress such as temperature change due to on/off switching of an optical semiconductor device, an adhesion property to a substrate of the semiconductor device as well as heat resistance and light resistance are important. However, typical silicone resins may not withstand the aforementioned stresses due to their relatively poor low-temperature properties, resulting in exfoliation of the resin.

It is known that introduction of a branched structure into a linear silicone chain is effective as a means for improving the low-temperature properties, and various investigations were made to provide methods for preparing such silicone resins (JP 2000-351949A, JP 2001-163981A, and JP 2002-348377A). In these methods, a hydrolyzable silane having an R3SiO1/2 unit [M unit] and an RSiO3/2 unit [T unit] is condensated/equilibrated in the presence of an acid or alkaline catalyst. However, the length of the main chain and a length of a branched cannot be independently controlled in these methods, and it is therefore difficult to obtain a siloxane of a desired structure.

JP 2016-204426A teaches that a cured product of an addition-curable silicone composition comprising an alkenyl group-containing branched organopolysiloxane having a short branch provides semiconductor device having good low- and high-temperature properties, excellent resistance to temperature changes, and high reliability.

In addition, an addition-curable silicone resin can be made into a value-added product by the addition of a phosphor, a white pigment, or an inorganic filler, and is used as a wavelength conversion layer, a light scattering material, a white reflective material, a high refractive index material, and a reinforcing material, (JP 2013-079328A, and JP 5844252B). However, inorganic fillers such as metal oxides generally have poor compatibility with silicones and also cause increased reflectance. Thus, a high load of an inorganic filler undesirably increases the viscosity, worsening the workability.

LIST OF REFERENCES

Patent Literature 1: JP 2009-256603A
Patent Literature 2: JP 2006-093354A
Patent Literature 3: JP 2000-351949A
Patent Literature 4: JP 2001-163981A
Patent Literature 5: JP 2002-348377A
Patent Literature 6: JP 2016-204426A
Patent Literature 7: JP 2013-079328A
Patent Literature 8: JP 5844252B

SUMMARY OF THE INVENTION

Therefore, there is a need for a cured product which exhibits adhesion better than those attained by the compositions described in the above-mentioned prior art documents, which has good compatibility with an inorganic filler, and which provides a highly reliable semiconductor device. The present invention has been made in view of the above-mentioned problems, and aims to provide an addition-curable silicone resin composition which has good compatibility with an inorganic filler and whose cured product exhibits good adhesion to a substrate, as well as a cured product thereof and a highly reliable semiconductor device encapsulated with the cured product.

Because the presence of an alkoxy or silanol group in an organopolysiloxane would cause surface tackiness in a cured product, it has not previously been practiced to actively leave an alkoxy group and a silanol group in addition-curable silicone resin compositions, particularly those used in semiconductor encapsulation. In a challenge to leave an alkoxy and/or silanol group in an organopolysiloxane, the present inventor has discovered that an addition-curable silicone resin composition comprising an organopolysiloxane having a specific amount of an alkoxy and/or silanol group provides a cured produce having excellent adhesion to a substrate, and has completed the present invention.

Thus, the present invention provides an addition-curable silicone resin composition comprising:

(A) a linear or branched organopolysiloxane having at least one alkenyl group, said organopolysiloxane comprising at least one unit selected from $R1R2SiO2/2 R1R22SiO1/2$ units, and at least one unit selected from $R2'2SiO2/2$, $R2'3SiO1/2$ and $R2'SiO3/2$ units, wherein a percentage of a total number of the $R1R2SiO2/2$ and $R1R22SiO1/2$ units, relative to a total number of all siloxane units, is from 0.001% to 50%, and wherein R1 is, independently at each occurrence, a hydroxy group or an alkoxy group of 1 to 30 carbon atoms; R2 is, independently at each occurrence, a group selected from a substituted or unsubstituted saturated hydrocarbon group of 1 to 12 carbon atoms, a substituted or unsubstituted aromatic hydrocarbon group of 6 to 12 carbon atoms, an alkenyl group of 2 to 10 carbon atoms, and the groups as defined for R1; and R2' is a groups selected from the groups as defined for R2 other than those as defined for R1, with the proviso that at least one of R2 and R2' is an alkenyl group;

(B) an organohydrogenpolysiloxane having at least two hydrosilyl groups, in an amount such that the ratio of the number of the hydrosilyl groups in component (B) to a total number of the alkenyl groups in component (A) is from 0.1 to 4; and (C) a catalytic amount of a hydrosilylation catalyst.

The present invention further provides a semiconductor devise comprising a semiconductor element encapsulated with a cured product of the above-described silicone resin composition.

EFFECTS OF THE INVENTION

A cured product of the addition-curable silicone resin composition according to the invention exhibits excellent adhesion to a substrate. In addition, the addition-curable silicone resin composition according to the invention has good compatibility with an inorganic filler, and a mixture of the composition with an inorganic filler has good fluidity and workability. According to the present invention, a highly reliable semiconductor device is provided by encapsulating a semiconductor element with a cured product of the composition.

DETAILED DESCRIPTION OF THE INVENTION

The present invention will be described in more detail.

[(A) Alkenyl Group-Containing Organopolysiloxane]

Component (A) has an alkenyl group, and is one of the major components of the silicone resin composition, which undergoes a hydrosilylation reaction with component (B) in the presence of component (C) to form a cured product. This component (A) is a linear or branched organopolysiloxane having at least one alkenyl group bonded to a silicone atom in a molecule.

Component (A) is a linear or branched organopolysiloxane having at least one alkenyl group, which comprises at least one unit selected from $R1R2SiO2/2$ and $R1R22SiO1/2$ units, and at least one unit selected from $R2'2SiO2/2$, $R2'3SiO1/2$ and $R2'SiO3/2$ units, wherein the percentage of the total number of the $R1R2SiO2/2$ and $R1R22SiO1/2$ units, relative to the total number of all siloxane units, is from 0.001% to 50%. This component is characterized by the $R1R2SiO2/2$ and $R1R22SiO1/2$ units in a proportion of from 0.001% to 50%, preferably from 0.01% to 40%, more preferably from 0.02% to 30%, in particular from 0.1% to 20%, relative to the total number of all siloxane units. In the siloxane units, R1 is a hydroxy group or an alkoxy group of 1 to 30 carbon atoms, preferably of 1 to 10 carbon atoms, and R2 is, independently at each occurrence, a group selected from a substituted or unsubstituted saturated hydrocarbon group of 1 to 12 carbon atoms, a substituted or unsubstituted aromatic hydrocarbon group of 6 to 12 carbon atoms, an alkenyl group of 2 to 10 carbon atoms, and the groups as defined for R1. On account of the units having a silanol group and/or an alkoxysilyl group in a proportion mentioned above, a cured product can be obtained which exhibits excellent adhesion to a substrate. Further, on account of specific amounts of a silanol group and/or an alkoxysilyl group, the organopolysiloxane has improved compatibility with an inorganic filler, and can provides a composition having good fluidity even when the inorganic filler is loaded in a large amount. In a case where the proportion of the $R1R2SiO2/2$ and $R1R22SiO1/2$ units is less than the lower limit indicated above, good adhesion to a substrate such as a silver plate cannot be obtained. In a case where the proportion exceeds the upper limit indicated above, the cured product may show surface tackiness, causing undesirable dust deposition.

R1 is a hydroxy group or an alkoxy group having 1 to 30, preferably 1 to 10, and more preferably 1 to 6 carbon atoms. R2 is, independently at each occurrence, a group selected from a substituted or unsubstituted saturated hydrocarbon group of 1 to 12 carbon atoms, preferably of 1 to carbon atoms, a substituted or unsubstituted aromatic hydrocarbon group of 6 to 12 carbon atoms, preferably of 6 to 8 carbon atoms, an alkenyl group of 2 to 10 carbon atoms, and the groups as defined for R1. Examples of the saturated or unsaturated hydrocarbon group include alkyl groups, such as methyl, ethyl, propyl, butyl and octyl groups; cycloalkyl groups, such as cyclopentyl and cyclohexyl groups; and derivatives thereof in which a part or all of the hydrogen atoms each bonded to a carbon atom of the aforementioned groups are substituted with a halogen atom, such as fluorine, bromine and chlorine atoms, or a cyano group, such as, for example, halogenated monovalent hydrocarbon groups, such as trifluoropropyl and chloropropyl groups; cyanoalkyl groups, such as β-cyanoethyl and γ-cyanopropyl groups; 3-methacryloxypropyl, 3-glycidyloxypropyl, 3-mercaptopropyl and 3-aminopropyl groups. Among these, methyl and cyclohexyl groups are preferred, with a methyl group being particularly preferred. Examples of the aromatic hydrocarbon group include aryl groups, such as phenyl, tolyl and naphthyl groups; and aralkyl groups, such as benzyl, phenylethyl and phenylpropyl groups. Among these, phenyl and tolyl groups are preferred, with a phenyl group being particularly preferred. Examples of the alkenyl group include vinyl, allyl, propenyl, hexenyl, styryl and ethynyl groups. Among these, vinyl and allyl groups are preferred, with a vinyl group being particularly preferred. Examples of the alkoxy group include methoxy, ethoxy, propoxy, isopropoxy, butoxy, isobutoxy, hexoxy, pentoxy, heptoxy, octoxy, nonanoxy, decanoxy and undecanoxy groups. Among these, methoxy, ethoxy, propoxy, isopropoxy, butoxy and isobutoxy groups are preferred.

Component (A) comprises at least one unit represented by $R1R2SiO2/2$ (D unit) or $R1R22SiO1/2$ (M unit). In other words, it comprises at least one, preferably two or more, of the D or M unit having at least one alkoxy or hydroxy group bonded to a silicon atom. It is particularly preferable to have an alkoxy or hydroxyl group bonded to a silicon atom in a side chain. That is, it is preferable to have at least one, preferably 1 to 100, $R1R2SiO2/2$ (D unit) having at least one alkoxy or hydroxy group bonded to a silicon atom. The alkoxy and/or hydroxy group is preferably present in a side chain for good storage stability.

Component (A) comprises, in addition to the $R1R2SiO2/2$ (D unit) and $R1R22SiO1/2$ (M unit), a siloxane unit selected from $R2'2SiO2/2$ (D unit), $R2'3SiO1/2$ (M unit) and $R2'SiO3/2$ (T unit), wherein R2' is a groups selected from the groups as defined for R2 other than those as defined for R1. In other words, R2' is, independently at each occurrence, a group selected from a substituted or unsubstituted saturated hydrocarbon group of 1 to 12 carbon atoms, preferably of 1 to carbon atoms, a substituted or unsubstituted aromatic hydrocarbon group of 6 to 12 carbon atoms, preferably of 6 to 8 carbon atoms, and an alkenyl group of 2 to 10 carbon atoms. Specific examples of R2' include the preferred examples for R2. The polysiloxane may also comprise a small amount of $SiO4/2$ units. The $SiO4/2$ units may be present in an amount such that a percentage of the number of the $SiO4/2$ units relative to the total number of all siloxane units is at most 5%, preferably from 0.001% to 3%.

At least one of R2 and R2' is an alkenyl group. There is no particular limitation on the alkenyl group content. Preferably, the alkenyl groups are present in a proportion of from 0.001% to 20% relative to the total number of all of the siloxane units. Although there is no particular limitation on the bonding site of the alkenyl groups, it is preferable to have at least one alkenyl group at an end, more preferably each one alkenyl group at each end.

Component (A) may or may not comprise an aromatic hydrocarbon group, so that the percentage of the number of the aromatic hydrocarbon groups bonded to a silicon atom, relative to the total number of all substituent groups (i.e., R1, R2 and R2') bonded to a silicon atom present in component (A), may be 0%. In a case where component (A) comprises an aromatic hydrocarbon group, the percentage of the number of the aromatic hydrocarbon groups bonded to a silicon atom, relative to the total number of all substituent groups (i.e., R1, R2 and R2') bonded to a silicon atom present in component (A), is preferably up to 90%, more preferably up to 85%, in particular up to 83%, and most preferably up to 80%. When the amount of the aromatic hydrocarbon groups is at or below the upper limit indicated above, it is possible to efficiently introduce the alkoxy or hydroxy group present on the R1R2SiO2/2 (D unit) and R1R22SiO1/2 (M unit) into component (A), and to ensure that the degree of freedom of the molecule for good mechanical properties. Although there is no particular lower limit on the percentage, it is preferably 3%, more preferably 5%, still more preferably 15%, and especially 25%.

Component (A) has a viscosity at 25° C. preferably in the range of 10 mPa·s to 100,000 mPa·s, more preferably from 100 mPa·s to 50,000 mPa·s, and still more preferably from 500 mPa·s to 30,000 mPa·s, as determined with a B-type viscometer according to the method described in JIS K 7117-1:1999. A shape of the composition is kept if the viscosity is equal to or more than the lower limit indicated above. Workability of the composition is kept good if the viscosity is equal to or less than the upper limit indicated above.

Component (A) may be represented, for instance, by the formulas shown below, although not limited thereto.

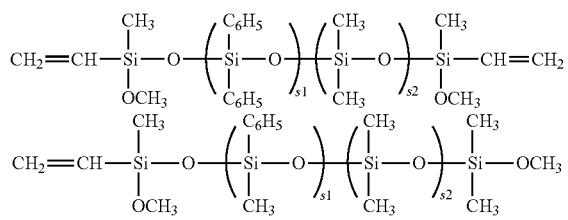

Wherein s1 and s2 are each an integer of 0 to 2,000. Preferably, s1 is an integer of 1 to 2,000.

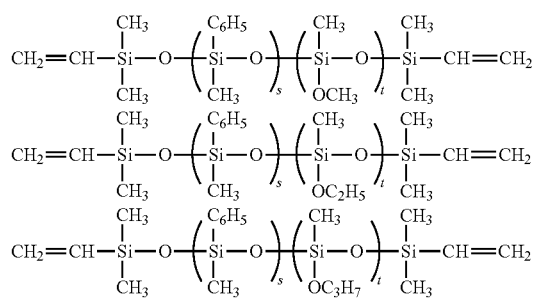

Wherein s is an integer of 0 to 2,000, preferably an integer of 1 to 2,000, and t is an integer of 1 to 2,000, preferably an integer of 2 to 1,000.

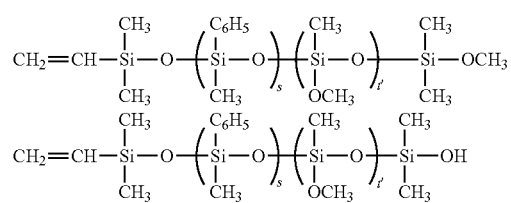

Wherein s and t' are each an integer of 0 to 2,000. Preferably, s is an integer of 1 to 1,000, and t' is an integer of 1 to 2,000.

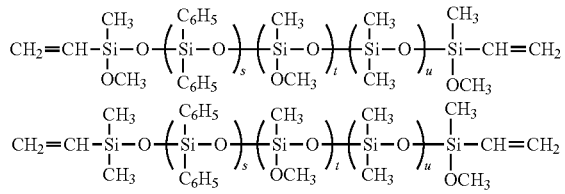

Wherein s and u are each an integer of 0 to 2,000, and t is an integer of 1 to 2,000. Preferably, s is an integer of 1 to 1,000, t is an integer of 1 to 1,000, and u is an integer of 1 to 2,000.

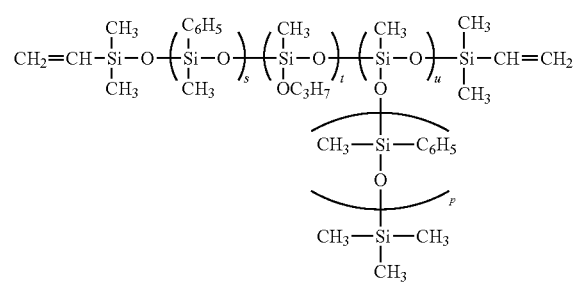

Wherein s and u are each an integer of 0 to 2,000, and t is an integer of 1 to 2,000. Preferably, s is an integer of 1 to 1,000, t is an integer of 1 to 1,000, and u is an integer of 1 to 100. In the same formula, p is an integer of 0 to 1,000, preferably an integer of 1 to 500.

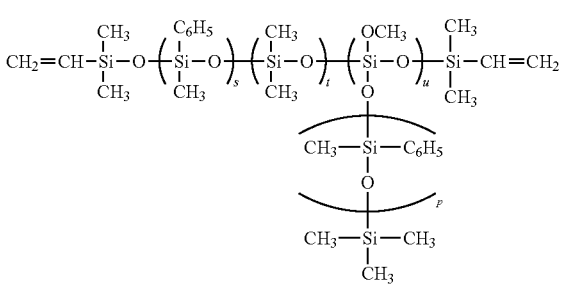

Wherein s and t are each an integer of 0 to 2,000, and u is an integer of 1 to 2,000. Preferably, s is an integer of 1 to 1,000, t is an integer of 1 to 2,000, and u is an integer of 1 to 100. Further, p is an integer of 0 to 1,000, preferably an integer of 1 to 500.

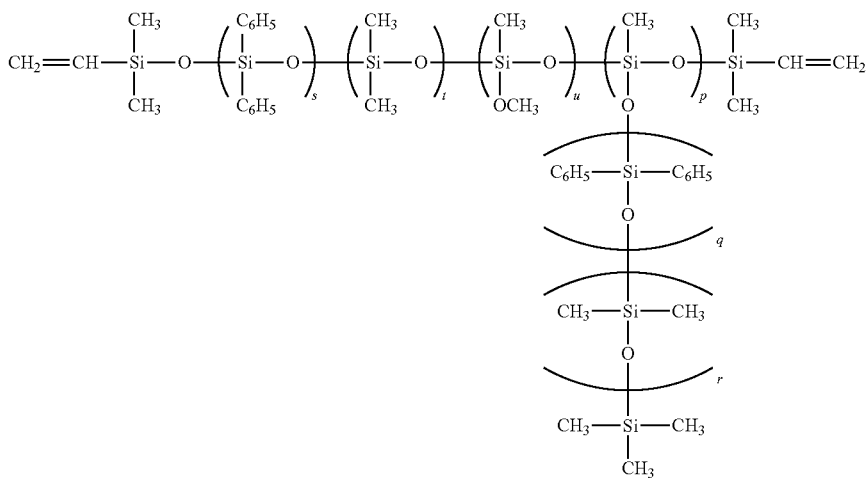

Wherein s, t, p, q and r are each an integer of 0 to 2,000, and u is an integer of 1 to 2,000. Preferably, s is an integer of 1 to 1,000, t is an integer of 1 to 2,000, u is an integer of 1 to 1,000, p is an integer of 0 to 100, and q or r are, independently of each other, an integer of 0 to 1,000.

In a particularly preferable embodiment, component (A) is an organopolysiloxane having a branched as shown above. Among them, an organopolysiloxane having a branched of 1 to 4 siloxane units is especially preferred. Such an organopolysiloxane has a lower glass transition temperature and exhibits improved resistance to temperature changes, as compared to an organopolysiloxane having a branched of 5 or more siloxane units. Thus, in addition to the advantages described above, such an organopolysiloxane provides a cured product having excellent crack resistance.

[(B) Organohydrogenpolysiloxane]

Component (B) is an organohydrogenpolysiloxane, and acts as a crosslinking agent to form a crosslinked structure through the hydrosilylation reaction with an alkenyl groups in component (A) and the optional component (D) so as to give a cured product. Component (B) may be any organohydrogenpolysiloxane, as long as it has at least two hydrosilyl groups in a molecule. For example, an organohydrogenpolysiloxane of the following formula (4) can be mentioned.

$$(R4_3SiO_{1/2})_{r'}(R4_2SiO_{2/2})_{s'}(R4SiO_{3/2})_{t'}(SiO_{4/2})_{u'} \quad (4)$$

wherein R4 is, independently at each occurrence, a group selected from a hydrogen atom, a substituted or unsubstituted saturated hydrocarbon group of 1 to 12 carbon atoms, and a substituted or unsubstituted aromatic hydrocarbon group of 6 to 12 carbon atoms, with proviso that at least two R4 groups are a hydrogen atom, and r' is an integer of 0 to 100, s' is an integer of 0 to 300, t' is an integer of 0 to 200, u' is an integer of 0 to 200, with the proviso that $2 \leq r'+s'+t'+u' \leq 800$.

The substituted or unsubstituted saturated hydrocarbon group of 1 to 12 carbon atoms and the substituted or unsubstituted aromatic hydrocarbon group of 6 to 12 carbon atoms mentioned for R4 include those mentioned for R2. At least two, preferably 2 to 50, of R4 are a hydrogen atom. R4 other than a hydrogen atom are preferably a methyl or phenyl group.

In the formula (4), r' is an integer of 0 to 100, preferably an integer of 0 to 75, and more preferably an integer of 0 to 50; s' is an integer of 0 to 300, preferably an integer of 0 to 200, and more preferably an integer of 0 to 100; t' is an integer of 0 to 200, preferably an integer of 0 to 100, and more preferably an integer of 0 to 50; u' is an integer of 0 to 200, preferably an integer of 0 to 100, and more preferably an integer of 0 to 50; with the proviso that $2 \leq r'+s'+t'+u' \leq 800$, preferably $2 \leq r'+s'+t'+u' \leq 400$, and more preferably $2 \leq r'+s'+t'+u' \leq 200$.

In component (B), it is preferable that the percentage of the number of the aromatic hydrocarbon groups each bonded to a silicon atom, relative to the total number of all of the substituent groups (i.e., R4) each bonded to a silicon atom is preferably from 3% to 90%, more preferably from 5% to 80%, and may be from 5% to 60%. Within this range, component (B), organohydrogenpolysiloxane, shows good compatibility with components (A) and (D), so that a cured product of excellent transparency can be obtained. Thus, the resulting composition can be suitably used for encapsulating semiconductor devices. It should be noted that component (B) may or may not comprise an aromatic hydrocarbon group, and the percentage may be 0%.

The amount of component (B), organohydrogenpolysiloxane having at least two hydrosilyl groups in a molecule, is such that the ratio of the number of the hydrosilyl groups in component (B) to the total number of the alkenyl groups in component (A) and the optional (D) component is from 0.1 to 4, preferably from 0.4 to 3, more preferably from 0.6 to 2, and still more preferably from 0.8 to 1.6. An amount less than the lower limit indicated above is undesirable, because it results in poor curability due to the insufficient amount of the hydrosilyl groups. An amount exceeding the upper limit indicated above is undesirable, because it tends to cause undesirable side reactions such as dehydrogenation due to the residual hydrosilyl groups.

[(C) Hydrosilylation Catalyst]

Component (C) is a hydrosilylation catalyst. The catalyst is not particularly limited as long as it promotes the addition reaction of components (A) and (D) with component (B). Any addition reaction catalyst known in the art may be used, and a catalyst selected from elemental metals of the platinum group and compounds of platinum group metals may be preferably used. Examples thereof include platinum-based catalysts, such as platinum (including platinum black), platinum chloride, chloroplatinic acid, a platinum-olefin complex such as platinum-divinylsiloxane complex, and a platinum-carbonyl complex; palladium-based catalysts; and rhodium-based catalysts. The catalyst may be used alone or in combination of two or more. Among them, chloroplatinic acid and a platinum-olefin complex such as platinum-divinylsiloxane complex are particularly preferred.

Component (C) may be used in a catalytic amount. The catalytic amount is an amount effective for promoting the hydrosilylation reaction, and may be appropriately adjusted, depending on a desired curing rate. From a viewpoint of a curing rate, the amount of the platinum-based catalyst preferably ranges from $1.0\times10^{-4}$ part by mass to 1.0 part by mass, in particular from $1.0\times10^{-3}$ part by mass to $1.0\times10^{-1}$ part by mass, of a platinum group metal, relative to 100 parts of the combined mass of components (A) and (B) and, if present, component (D).

[(D) Alkenyl Group-Containing Organopolysiloxane]

Preferably, the composition according to the invention further comprises (D) an alkenyl group-containing organopolysiloxane having a network structure and represented by the following formula (3). The use of component (D) in combination with component (A) enhances the strength of the cured resin.

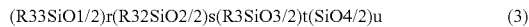

$$(R3_3SiO_{1/2})_r(R3_2SiO_{2/2})_s(R3SiO_{3/2})_t(SiO_{4/2})_u \quad (3)$$

wherein R3 is, independently at each occurrence, a group selected from a substituted or unsubstituted saturated hydrocarbon group of 1 to 12 carbon atoms, a substituted or unsubstituted aromatic hydrocarbon group of 6 to 12 carbon atoms, an alkenyl group of 2 to 10 carbon atoms, an alkoxy group of 1 to 10 carbon atoms bonded to a silicon atom, and a hydroxy group, wherein at least two of the R3 groups are an alkenyl group, r is an integer of 0 to 100, s is an integer of 0 to 300, t is an integer of 0 to 200, u is an integer of 0 to 200, $1 \le t+u \le 400$, and $2 \le r+s+t+u \le 800$.

In the formula (3), R3 is, independently at each occurrence, a group selected from a hydroxy group, an alkoxy group of 1 to 10 carbon atoms, preferably of 1 to 6 carbon atoms, a substituted or unsubstituted saturated hydrocarbon group of 1 to 12 carbon atoms, preferably of 1 to 6 carbon atoms, a substituted or unsubstituted aromatic hydrocarbon group of 6 to 12 carbon atoms, preferably of 6 to 8 carbon atoms, and an alkenyl group of 2 to 10 carbon atoms. Examples of the substituted or unsubstituted hydrocarbon groups include alkyl groups, such as methyl, ethyl, propyl, butyl and octyl groups; cycloalkyl groups, such as cyclopentyl and cyclohexyl groups; and derivatives thereof in which a part or all of hydrogen atoms bonded to a carbon atom of the aforementioned groups are substituted with a halogen atom, such as fluorine, bromine and chlorine atoms, or a cyano group, including, for example, halogenated monovalent hydrocarbon groups, such as trifluoropropyl and chloropropyl groups; cyanoalkyl groups, such as β-cyanoethyl and γ-cyanopropyl groups; 3-methacryloxypropyl, 3-glycidyloxypropyl and 3-aminopropyl groups. Among these, methyl and cyclohexyl groups are preferred, with a methyl group being particularly preferred. Examples of the aromatic hydrocarbon group include aryl groups, such as phenyl, tolyl and naphthyl groups; and aralkyl groups, such as benzyl, phenylethyl and phenylpropyl groups. Among these, phenyl and tolyl groups are preferred, with a phenyl group being particularly preferred. Examples of the alkenyl group include vinyl, allyl, propenyl, hexenyl, styryl and ethynyl groups. Among these, vinyl and allyl groups are preferred, with a vinyl group being particularly preferred. Examples of the alkoxy group include methoxy, ethoxy, propoxy, isopropoxy and butoxy groups. Among these, methoxy, ethoxy, propoxy and isopropoxy groups are preferred.

In the formula (3), r is an integer of 0 to 100, preferably an integer of 0 to 75, and more preferably an integer of 0 to 50; s is an integer of 0 to 300, preferably an integer of 0 to 200, and more preferably an integer of 0 to 100; t is an integer of 0 to 200, preferably an integer of 3 to 100, and more preferably an integer of 5 to 50; u is an integer of 0 to 200, preferably an integer of 0 to 100, and more preferably an integer of 0 to 50; provided that $1 \le t+u \le 400$, preferably $1 \le t+u \le 200$, and more preferably $3 \le t+u \le 100$, and $2 \le r+s+t+u \le 800$, preferably $2 \le r+s+t+u \le 400$, and more preferably $2 \le r+s+t+u \le 200$.

In component (D), the percentage of the number of the aromatic hydrocarbon groups each bonded to a silicon atom relative to the total number of all of the substituent groups (i.e., R3) each bonded to a silicon atom is preferably from 3% to 90%, more preferably from 5% to 80%, and may be from 10% to 60%. By comprising the aromatic hydrocarbon groups within the range indicated above, the composition comprising component (D) provides a cured product having a higher refractive index and less gas permeability. Further, component (D) has good compatibility with component (A), so as to provide a cured product having excellent transparency and mechanical strength. Accordingly, the resulting composition can be suitably used for encapsulating semiconductor devices. It should be noted that component (D) may or may not comprise an aromatic hydrocarbon group, and the percentage may be 0%.

The amount of component (D) may be from 10 to 10,000 parts by mass, preferably from 30 to 3,000 parts by mass, more preferably from 80 to 1,000 parts by mass, and especially from 100 to 500 parts by mass, relative to 100 parts by mass of component (A).

[Other Components]

In addition to components (A) to (D), the curable composition according to the invention may further comprise, if necessary, one or more phosphors, inorganic fillers, adhesion promoters and other additives. Each of these components will be described below.

[Phosphor]

There is no particular limitation on the phosphor, and any phosphor known in the art may be used. For example, preferred are those that absorb light emitted from a semiconductor element, in particular a semiconductor light-emitting diode comprising a nitride-based semiconductor as a light emitting layer, and that cause wavelength conversion to emit light of a different wavelength. Such a phosphor is preferably at least one phosphor selected from, for example, nitride- and oxynitride-based phosphors activated mainly with a lanthanide element, such as Eu or Ce; alkaline earth metal halogen apatite phosphors, alkaline earth metal borate halogen phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, or germanate phosphors, each activated mainly with a lanthanide element such as Eu or a transition metal element such as Mn; rare earth aluminate phosphors or rare earth silicate phosphors, each activated mainly with a lanthanide element such as Ce; organic or organic complex phosphors activated mainly with a lanthanide element such as Eu; or Ca—Al—Si—O—N oxynitride glass phosphors.

Examples of the nitride-based phosphor activated mainly with a lanthanide element, such as Eu or Ce, include $M_2Si_5N_8$:Eu (M is at least one selected from Sr, Ca, Ba, Mg and Zn). Also included are $MSi_7N_{10}$:Eu, $M_{1.8}Si_5O_{0.2}N_8$:Eu, and $M_{0.9}Si_7O_{0.1}N_{10}$:Eu (M is at least one selected from Sr, Ca, Ba, Mg and Zn).

Examples of the oxynitride-based phosphor activated mainly with a lanthanide element, such as Eu or Ce, include MSi2O2N2:Eu (M is at least one selected from Sr, Ca, Ba, Mg and Zn).

Examples of the alkaline earth metal halogen apatite phosphor activated mainly with a lanthanide element such as Eu or a transition metal element such as Mn include M5(PO4)3X:R (M is at least one selected from Sr, Ca, Ba, Mg and Zn; X is at least one selected from F, Cl, Br and I; and R is at least one selected from Eu, Mn, Eu and Mn).

Examples of the alkaline earth metal borate halogen phosphor include M2B5O9X:R (M is at least one selected from Sr, Ca, Ba, Mg and Zn; X is at least one selected from F, Cl, Br and I; and R is at least one selected from Eu, Mn, Eu and Mn).

Examples of the alkaline earth metal aluminate phosphor include SrAl2O4:R, Sr4Al14O25:R, CaAl2O4:R, BaMg2Al16O27:R, BaMg2Al16O12:R, and BaMgAl10O17:R (R is at least one selected from Eu, Mn, Eu and Mn).

Examples of the alkaline earth metal sulfide phosphor include La2O2S:Eu, Y2O2S:Eu, and Gd2O2S:Eu.

Examples of the rare earth aluminate phosphor activated mainly with a lanthanide element such as Ce include YAG-type phosphors of compositional formulas:Y3Al5O12:Ce, (Y0.8Gd0.2)3Al5O12:Ce, Y3(Al0.8Ga0.2)5O12:Ce, and (Y,Gd)3(Al,Ga)5O12. Also included are those in which a part or all of Y is substituted with Tb or Lu, such as Tb3Al5O12:Ce and Lu3Al5O12:Ce.

Examples of other phosphors include ZnS:Eu, Zn2GeO4: Mn, and MGa2S4:Eu (M is at least one selected from Sr, Ca, Ba, Mg, and Zn; and X is at least one selected from F, Cl, Br, and I.).

The phosphors described above may optionally comprise, in place of or in addition to Eu, at least one selected from Tb, Cu, Ag, Au, Cr, Nd, Dy, Co, Ni, and Ti.

The Ca—Al—Si—O—N oxynitride glass phosphor is a phosphor comprising, as a matrix material, 20 to 50 mol % of CaCO3, calculated as CaO, 0 to 30 mol % of $Al_2O_3$, 25 to 60 mol % of SiO, 5 to 50 mol % of AlN, and 0.1 to 20 mol % of a rare earth or transition metal oxide, with the total of these five ingredients being 100 mol %. The phosphor having an oxynitride glass matrix preferably has a nitrogen content of up to 15% by mass, and preferably comprises, besides the rare earth oxide ion, another rare earth ion that works as a sensitizer in an amount of 0.1 to 10 mol % in the form of a rare earth oxide as a co-activator in the phosphor glass.

Further, other phosphors which exhibit similar performance and effects may be used.

The amount of the phosphor is preferably from 0.1 to 2,000 parts by mass, and more preferably from 0.1 to 100 parts by mass, relative to 100 parts by mass of the other component, such as components (A), (B), (C) and (D). In a case where the cured product of the invention is used as a wavelength conversion film containing a phosphor, the phosphor content is preferably from 10 to 2,000 parts by mass. It is also preferable that the phosphor has an average particle diameter of at least 10 nm, more preferably in the range of from 10 nm to 10 μm, and more preferably from 10 nm to 1 μm. The average particle diameter is determined by particle size distribution measurement using a laser light diffraction method, e.g., with a Cilas laser analyzer.

[Inorganic Filler]

Examples of the inorganic filler include silica, nanosilica, fumed silica, fumed titanium oxide, alumina, calcium carbonate, calcium silicate, titanium oxide, iron (III) oxide, zirconium oxide, nanozirconia and zinc oxide. The inorganic filler may be used alone or in combination of two or more. There is no particular limitation on the amount of the inorganic filler. The inorganic filler may be added in an amount of up to 9,000 parts by mass, preferably in the range of from 0.1 to 6,000 parts by mass, more preferably from 0.5 to 2,000 parts by mass, still more preferably from 1 to 800 parts by mass, and especially from 5 to 500 parts by mass, relative to 100 parts of the total mass of component (A), (B), (C) and, optionally, (D). The addition-curable silicone resin composition according to the invention has good compatibility with the inorganic filler, and can provide a composition having good fluidity and therefore good workability even when a large amount of the inorganic filler is added.

[Adhesion Promoter]

The curable composition according to the invention may contain an adhesion promoter, if necessary to impart stronger adhesion. Examples of the adhesion promoter include, organosiloxane oligomers having at least two, more preferably at least three, hydrogen atoms each bonded to a silicone atom or functional groups selected from alkenyl, alkoxy and epoxy groups, per molecule. The organosiloxane oligomer preferably has 4 to 50 silicon atoms, more preferably 4 to 20 silicon atoms. Isocyanurate compounds of the following general formula (5) and their hydrolysis condensates may also be used as the adhesion promoter.

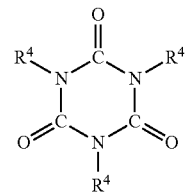

(5)

In the formula (5), $R^4$ is, independently at each occurrence, an organic group of the formula (6) shown below, an aliphatic unsaturated hydrocarbon group of 2 to 10 carbon atoms, or a monovalent hydrocarbon having an isocyanate group.

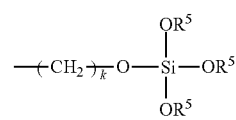

(6)

wherein $R^5$ is a hydrogen atom or a monovalent hydrocarbon of 1 to 6 carbon atoms, k is an integer of 1 to 6, preferably an integer of 1 to 4.

The amount of the adhesion promoter is preferably up to 10 parts by mass, more preferably from 0.1 to 8 parts by mass, and especially preferably from 0.2 to 5 parts by mass, relative to 100 parts of the total mass of component (A), (B), (C) and (D). If the amount does not exceed the upper indicated above, a cured product having higher hardness can be obtained, while suppressing the surface tackiness.

[Cure Inhibitor]

The curable composition according to the invention may further comprise a cure inhibitor in order to control the reactivity to improve storage stability. The cure inhibitor may be a compound selected from the group consisting of triallylisocyanurate, alkyl maleates, acetylene alcohols and silane- or siloxane-modified products thereof, hydroperoxides, tetramethylethylenediamine, benzotriazole and a mixture thereof. The amount of the curing inhibitor is preferably 0.001 to 1.0 parts by mass, and more preferably from 0.005 to 0.5 parts by mass, relative to 100 parts of the total mass of component (A), (B), (C) and (D).

[Other Additives]

In addition to the components described above, the curable composition according to the invention may further contain one or more other additives. Examples of such other additives include anti-aging agents, radical polymerization inhibitors, flame retardants, surfactants, antiozonants, light stabilizers, thickeners, plasticizers, antioxidants, heat stabilizers, electrical conductivity-imparting agents, antistatic agents, radiation shielding agents, nucleating agents, phosphorus-type peroxide decomposers, lubricants, pigments, metal deactivators, physical property regulators and organic solvents. These optional components may be used alone or in combination of two or more.

One of the preferable embodiments of the invention relates to a curable composition composed of components (A), (B), (C) and (D), preferably to a composition composed of components (A), (B), (C) and (D) and a phosphor. In order to obtain a cured product having high transparency, the composition preferably does not contain any inorganic filler such as silica filler. Examples of the inorganic filler are as mentioned above.

There is no particular limitation on a method for preparing the curable composition of the invention, and any method known in the art may be used. For instance, the composition may be prepared by mixing components (A), (B), (C) and the optional (D) in any manner. Alternatively, the composition may be prepared by mixing components (A), (B), (C) and the optional (D) and phosphor, or by mixing components (A), (B), (C) and the optional (D) and any other optional component in any manner. For instance, the composition may be prepared by placing the components in a commercially available mixer (e.g., THINKY CONDITIONING MIXER, from Thinky Corporation (Tokyo, Japan)), and homogeneously mixing them for one to five minutes.

There is no particular limitation on a method for curing the curable composition of the invention, and any method known in the art may be used. For instance, the composition may be cured at a temperature in the range of 60° C. to 180° C. for about 1 to 12 hours. Preferably, the composition is cured stepwise over a temperature in the range of from 60° C. to 150° C. The stepwise curing preferably includes two steps described below. First, the curable composition is heated at a temperature of 60° C. to 100° C. for 0.5 to 4 hours, so that the composition is sufficiently defoamed. Then, the composition is heated at a temperature of 120° C. to 180° C. for 1 to 10 hours for curing. By subjecting the composition to these steps, the composition can be fully cured, without generating bubbles, to form a colorless and transparent product even when the cured product has a large thickness. As used herein, the term "colorless and transparent cured product" means that a product of a 1 mm thickness exhibits a light transmittance of at least 80%, preferably at least 85%, and more preferably at least 90%, as measured at a wavelength of 450 nm.

The curable composition according to the invention provides a cured product having a high optical transparency. Accordingly, the curable composition of the invention is useful for encapsulating LED elements, in particular, blue LED and ultraviolet LED elements. The LED element may be encapsulated with the curable composition in any known manners. For instance, the encapsulation may be carried out by a dispense method or a compression molding method.

The curable composition and its cured product according to the invention has excellent properties, such as crack resistance, heat resistance, light resistance and optical transparency and are, therefore, useful as materials for displays, optical recording media, optical apparatus, optical parts and optical fibers, optical and electronic functional organic materials, and peripheral materials for semiconductor integrated circuits.

EXAMPLES

The invention will be further described with reference to the following Examples and Comparative Examples, which should not to be construed to limit the scope of the present invention. It is noted that term "part" hereinafter is in mass. The abbreviations Me, Vi and Ph, stand for methyl, vinyl and phenyl groups, respectively. An SiH/SiVi ratio refers to a ratio of the total number of the hydrogen atoms each bonded to a silicon atom in component (B) to the total number of the vinyl groups each bonded to a silicon atom in component (A), or, for a composition containing component (D), a ratio of the total number of hydrosilyl groups each bonded to a silicon atom in component (B) to the total number of vinyl groups each bonded to a silicon atom in components (A) and (D).

The weight average molecular weight (Mw) shown in the following Examples and Comparative Examples was determined by gel permeation chromatography (GPC) relative to polystyrene standards.

[Conditions for GPC]

Eluent: tetrahydrofuran

Flow rate: 0.6 mL/min

Columns: TSK Guardcolumn SuperH-L

TSKgel SuperH4000 (6.0 mm I.D.×15 cm×1)

TSKgel SuperH3000 (6.0 mm I.D.×15 cm×1)

TSKgel SuperH2000 (6.0 mm I.D.×15 cm×2)

(All available from Tosoh Corp.)

Column temperature: 40° C.

Injected sample amount: 20 μL (0.5 mass % in tetrahydrofuran)

Detector: differential refractive index detector (RI)

Example 1

The following components (A), (D) and (B) were mixed in a vessel:

(A) 10 parts of branched phenylmethylpolysiloxane composed of 3.99 mol % of $MeSiO_{3/2}$ unit, 84 mol % of $PhMeSiO_{2/2}$ unit, 12 mol % of $ViMe_2SiO_{1/2}$ unit and 0.01 mol % of $Me(CH_3O)SiO_{2/2}$ unit (Mw=5,200; percentage of the number of the aromatic groups relative to the total number of all of the substituents=42%);

(D) 30 parts of phenylmethylpolysiloxane of a resin structure, composed of 78 mol % of $PhSiO_{3/2}$ unit and 22 mol % of $ViPhMeSiO_{1/2}$ unit (Mw=2,200; percentage of the number of the aromatic groups relative to the total number of all of the substituents=54%); and (B) organohydrogenpolysiloxane of the following formula (8):

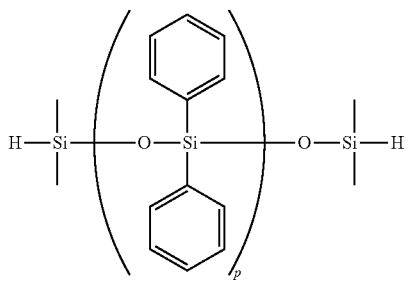

(8)

wherein p=1 on average) percentage of the number of the aromatic groups relative to the total number of all of the substituents=25%, in an amount such that the SiH/SiVi ratio was 1.0.

Then, the following component (C) was added in the vessel and thoroughly stirred to obtain a silicone resin composition. (C) a solution of octyl alcohol modified chloroplatinic acid (platinum element content=1 mass %) in an amount of 0.01 part (i.e., 2 ppm by mass of platinum element relative to the total mass of components (A), (B) and (D)).

Example 2

A silicone resin composition was obtained by repeating the procedures of Example 1, except that component (A) was replaced with 10 parts of branched phenylmethylpolysiloxane composed of 3.999 moil of $MeSiO_{3/2}$ unit, 84 mol % of $PhMeSiO_{2/2}$ unit, 12 mol % of $ViMe_2SiO_{1/2}$ unit and 0.001 mol % of Me (CH$_3$O) SiO$_{2/2}$ unit (Mw=6,200; percentage of the number of the aromatic groups relative to the total number of all of the substituents=40%).

Example 3

A silicone resin composition was obtained by repeating the procedures of Example 1, except that component (A) was replaced with 10 parts of linear phenylmethylpolysiloxane composed of 40 mol % of PhMeSiO$_{2/2}$ unit, 10 mol % of ViMe$_2$SiO$_{1/2}$ unit and 50 mol % of Me(C$_3$H$_7$O)SiO$_{2/2}$ unit (Mw=7,500; percentage of the number of the aromatic groups relative to the total number of all of the substituents=19%).

Example 4

A silicone resin composition was obtained by repeating the procedures of Example 1, except that component (A) was replaced with 10 parts of linear phenylmethylpolysiloxane composed of 90 mol % of PhMeSiO$_{2/2}$ unit, 9.99 mol % of ViMe$_2$SiO1/2 unit and 0.01 mol % of Me2(OH)SiO1/2 unit (Mw=3,200; percentage of the number of the aromatic groups relative to the total number of all of the substituents=43%).

Example 5

A silicone resin composition was obtained by repeating the procedures of Example 1, except that component (A) was replaced with 10 parts of branched phenylmethylpolysiloxane composed of 0.3 mol % of SiO4/2 unit, 30 mol % of Ph2SiO2/2 unit, 60 mol % of Me2SiO2/2 unit, 9 mol % of ViMe2SiO1/2 unit and 0.7 mol % of (C3H7O)2SiO2/2 unit (Mw=3,200; percentage of the number of the aromatic groups relative to the total number of all of the substituents=29%).

Example 6

The following components (A), (D) and (B) were mixed in a vessel:
(A) 10 parts of branched phenylmethylpolysiloxane composed of 30 mol % of PhSiO3/2 unit, 60 mol % of Ph2SiO2/2 unit, 9.9 mol % of ViMe2SiO1/2 unit and 0.1 mol % of Me2 (OH) SiO1/2 unit (Mw=5,200; percentage of the number of the aromatic groups relative to the total number of all of the substituents=83%);
(D) 20 parts of phenylmethylpolysiloxane of a resin structure, composed of 50 mol % of SiO4/2 unit, 22 mol % of ViPhMeSiO1/2 unit and 28 mol % of Me3SiO1/2 unit (Mw=5,200; percentage of the number of the aromatic groups relative to the total number of all of the substituents=15%); and
(B) organohydrogenpolysiloxane of the following formula (14):

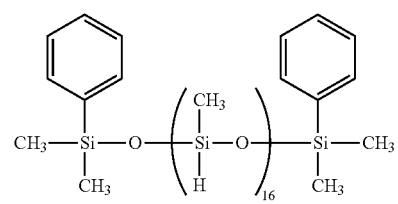

(14)

(percentage of the number of the aromatic groups relative to the total number of all of the substituents=5%) in an amount such that the SiH/SiVi ratio was 1.2.

Then, the following component (C) was added in the vessel and thoroughly stirred to obtain a silicone resin composition. (C) a solution of octyl alcohol modified chloroplatinic acid (platinum element content=1 mass %) in an amount of 0.01 part (i.e., 2 ppm by mass of platinum element relative to the total mass of components (A), (B) and (D)).

Example 7

The following components (A) and (B) were mixed in a vessel:
(A) 10 parts of linear dimethylpolysiloxane composed of 88 mol % of Me$_2$SiO$_{2/2}$ unit, 2 mol % of ViMe$_2$SiO$_{1/2}$ unit and 10 mol % of Me (i-C$_4$H$_9$ (CH$_3$)CHO) SiO$_{1/2}$ unit (Mw=14,200); and
(B) organohydrogenpolysiloxane of the following formula (16):

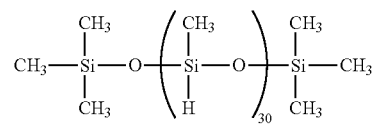

(16)

in an amount such that the SiH/SiVi ratio was 1.2.

Then, the following component (C) was added in the vessel and thoroughly stirred to obtain a silicone resin composition. (C) a solution of octyl alcohol modified chloroplatinic acid (platinum element content=1 mass %) in an amount of 0.01 part (i.e., 2 ppm by mass of platinum element relative to the total mass of components (A) and (B)).

Comparative Example 1

A silicone resin composition was obtained by repeating the procedures of Example 1, except that component (A) was replaced with 10 parts of linear phenylmethylpolysiloxane composed of 88 mol % of $PhMeSiO_{2/2}$ unit and 12 mol % of $ViMe_2SiO_{1/2}$ unit (Mw=3,000; percentage of the number of the aromatic groups relative to the total number of all of the substituents=42%).

Comparative Example 2

A silicone resin composition was obtained by repeating the procedures of Example 1, except that component (A) was replaced with 10 parts of branched phenylmethylpolysiloxane composed of 3.9995 mol % of $MeSiO_{3/2}$ unit, 84 mol % of $PhMeSiO_{2/2}$ unit, 12 mol % of $ViMe_2SiO_{1/2}$ unit and 0.0005 mol % of $Me(CH_3O)SiO_{2/2}$ unit (Mw=5,300; percentage of the number of the aromatic groups relative to the total number of all of the substituents=40%).

Comparative Example 3

A silicone resin composition was obtained by repeating the procedures of Example 1, except that component (A) was replaced with 10 parts of linear phenylmethylpolysiloxane composed of 30 mol % of $PhMeSiO_{2/2}$ unit, 10 mol % of $ViMe_2SiO_{1/2}$ unit and 60 mol % of $Me(C_3H_7O)SiO_{2/2}$ unit (Mw=7,700; percentage of the number of the aromatic groups relative to the total number of all of the substituents=14%).

Each of the silicone compositions obtained in the above-described Examples and Comparative Examples was cured in a mold under heating at 150° C. for 4 hours to obtain a cured product of 120 mm×110 mm×1 mm. On each of the organopolysiloxane compositions and the cured products, physical properties were evaluated by the methods described below. The results are shown in Tables 1 and 2.

[Methods for Evaluating Physical Properties]

(1) Appearance

The color and optical transparency were visually inspected on the cured product (1 mm thick) obtained by curing each of the compositions at 150° C. for 4 hours.

(2) State

Fluidity was examined on each of the compositions before cured. Fifty grams of the composition was placed in a 100 ml glass bottle. The bottle was laid down and left still at 25° C. for 10 minutes. If the composition flowed out from the bottle during that period, it was judged liquid.

(3) Viscosity

The viscosity was determined at 25° C. for each composition before cured, with a B-type rotational viscometer according to the method described in JIS K 7117-1:1999.

(4) Refractive Index

The refractive index was determined at 589 nm and at 25° C. according to JIS K 7142:2008, with an Abbe-type refractometer on the cured product obtained by curing each of the compositions at 150° C. for 4 hours.

(5) Hardness (Type D)

The hardness was determined according to JIS K 6249: 2003, with a durometer type D on the cured product obtained by curing each of the compositions at 150° C. for 4 hours.

(6) Elongation at Break and Tensile Strength

The elongation at break and the tensile strength were determined according to JIS K 6249:2003 on the cured product obtained by curing each of the compositions at 150° C. for 4 hours.

(7) Surface Tackiness

The surface tackiness was examined on the cured product obtained by curing each of the compositions at 150° C. for 4 hours, by visual inspection for the presence of dust deposited on the surface of the cured product.

(8) Adhesion 0.25 Gram of each composition was placed with a base area of 45 mm² on a silver plate an area of 180 mm² and was cured at 150° C. for 4 hours. The cured product was broken by a micro spatula and torn off from the silver plate. The percentages of parts of cohesive failure and peeled parts were determined. Adhesion was evaluated on the following criteria.

(Evaluation Criteria)

G: good adhesion with a percentage of cohesive failure of 60% or more;

P: poor adhesion with a percentage of cohesive failure of less than 60%.

(9) Fluidity after Admixing an Inorganic Filler

To 10 g of each of the compositions was admixed 25 g of titanium oxide (CR-95 from Ishihara Sangyo Kaisha, Ltd.) as an inorganic filler. One gram of the resulting mixture was applied onto a glass substrate, and then the glass substrate was inclined at an angle of 30° and held at that angle for 5 minutes to evaluate fluidity of the mixture.

(Evaluation Criteria)

G: good fluidity, with the mixture flowing;

P: poor fluidity, with no mixture flowing.

TABLE 1

| | Examples | | | | | | |
|---|---|---|---|---|---|---|---|
| | 1 | 2 | 3 | 4 | 5 | 6 | 7 |
| Appearance | colorless and transparent | colorless and transparent | colorless and transparent | colorless and transparent | colorless and transparent | colorless and transparent | colorless and transparent |
| State | liquid | liquid | liquid | liquid | liquid | liquid | liquid |
| Viscosity (Pa · s) | 3 | 3 | 3 | 4 | 4 | 15 | 1 |
| Refractive index | 1.54 | 1.54 | 1.54 | 1.54 | 1.53 | 1.49 | 1.41 |
| Hardness (Type D) | | | | | | | |
| 150° C. × 4 hrs | 55 | 58 | 50 | 53 | 57 | 20 | A30 |
| Elongation at break (%) | 60 | 55 | 70 | 80 | 65 | 40 | 40 |
| Tensile strength (mPa) | 4 | 5 | 3 | 3 | 4 | 2 | 2 |
| Dust deposition due to surface tackiness | no | no | no | no | no | no | no |
| Adhesion (on the Ag plate) | G | G | G | G | G | G | G |

TABLE 1-continued

| | Examples | | | | | | |
|---|---|---|---|---|---|---|---|
| | 1 | 2 | 3 | 4 | 5 | 6 | 7 |
| Fluidity after the addition of the inorganic filler | G | G | G | G | G | G | G |

TABLE 2

| | Comparative Examples | | |
|---|---|---|---|
| | 1 | 2 | 3 |
| Appearance | colorless and transparent | colorless and transparent | colorless and transparent |
| State | liquid | liquid | liquid |
| Viscosity (Pa · s) | 3 | 3 | 3 |
| Refractive index | 1.54 | 1.54 | 1.53 |
| Hardness (Type D) 150° C. × 4 hrs | 55 | 57 | 46 |
| Elongation at break (%) | 55 | 50 | 60 |
| Tensile strength (mPa) | 4 | 3 | 2 |
| Dust deposition due to surface tackiness | no | no | yes |
| Adhesion (on the Ag plate) | P | P | G |
| Fluidity after the addition of the inorganic filler | P | P | G |

As shown in Table 1, the silicone resin compositions of Examples 1 to 7 comprising component (A), organopolysiloxanes having the specific amount of alkoxy and/or hydroxy groups, provided the cured products which were colorless and transparent and exhibited the sufficient hardness, elongation at break and tensile strength, and the good refractive index and adhesion. These cured products did not show dust deposition caused by surface tackiness. In contrast, as shown in Table 2, the cured products each obtained from the silicone resin composition comprising the organopolysiloxane having alkoxy and/or hydroxy groups in the amount less than the lower limit specified in the present invention, or having no alkoxy/hydroxy group showed the poor adhesion, and lost fluidity when titanium oxide is added (Comparative Examples 1 and 2). The silicone composition comprising the organopolysiloxane having alkoxy and/or hydroxy group in the amount larger than the upper limit specified in the present invention showed surface tackiness, causing deposition of dust (Comparative Example 3).

The addition-curable silicone resin composition according to the invention exhibits excellent adhesion to a substrate such as silver plate. The addition-curable silicone resin composition according to the invention also has good compatibility with an inorganic filler and, therefore, shows good fluidity and workability even when the inorganic filler is added in a large amount. The cured product of the addition-curable silicone resin composition according to the invention does not exhibit surface tackiness, and provides a highly reliable semiconductor device by encapsulating a semiconductor element with the cured product.

The invention claimed is:

1. An addition-curable silicone resin composition comprising:
(A) a linear or branched organopolysiloxane having at least one alkenyl group, said organopolysiloxane comprising at least one $R^1R^2SiO_{2/2}$ unit and an optional $R^1R^2{}_2SiO_{1/2}$ unit, and at least one unit selected from $R^{2'}{}_2SiO_{2/2}$, $R^{2'}{}_3SiO_{1/2}$ and $R^{2'}SiO_{3/2}$ units, wherein a percentage of a total number of the $R^1R^2SiO_{2/2}$ and $R^1R^2{}_2SiO_{1/2}$ units, relative to a total number of all siloxane units, is from 0.001% to 50%, and wherein $R^1$ is, independently at each occurrence, a hydroxy group or an alkoxy group of 1 to 30 carbon atoms; $R^2$ is, independently at each occurrence, a group selected from a substituted or unsubstituted saturated hydrocarbon group of 1 to 12 carbon atoms, a substituted or unsubstituted aromatic hydrocarbon group of 6 to 12 carbon atoms, an alkenyl group of 2 to 10 carbon atoms, and the groups as defined for $R^1$; and $R^{2'}$ is a groups selected from the groups as defined as defined for $R^2$ other than those as defined for $R^1$, with the proviso that at least one of $R^2$ and $R^{2'}$ is an alkenyl group, and the organopolysiloxane has no $SiO_{4/2}$ unit or comprises a $SiO_{4/2}$ unit in an amount such that a percentage of the number of the $SiO_{4/2}$ unit relative to the total number of all siloxane units is 5% or smaller, and wherein said component (A) includes at least one aromatic hydrocarbon group bonded to a silicon atom:
(B) an organohydrogenpolysiloxane having at least two hydrosilyl groups represented by the following formula (4), in an amount such that the ratio of the number of the hydrosilyl groups in component (B) to a total number of the alkenyl groups in component (A) is from 0.1 to 4:

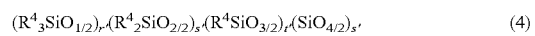
$(R^4{}_3SiO_{1/2})_{r'}(R^4{}_2SiO_{2/2})_{s'}(R^4SiO_{3/2})_{t'}(SiO_{4/2})_{s'}$ (4)

wherein $R^4$ is, independently at each occurrence, a group selected from a hydrogen atom, a substituted or unsubstituted saturated hydrocarbon group of 1 to 12 carbon atoms, and a substituted or unsubstituted aromatic hydrocarbon group of 6 to 12 carbon atoms, with the proviso that at least two $R^4$ groups are a hydrogen atom, $r'$ is an integer of 0 to 100, $s'$ is an integer of 0 to 300, $t'$ is an integer of 0 to 200, $u'$ is an integer of 0 to 200, provided that $2 \le r'+s'+t'+u' \le 800$; and
(C) a catalytic amount of a hydrosilylation catalyst.

2. The addition-curable silicone resin composition of claim 1, further comprising: (D) an organopolysiloxane having a network structure and represented by the following formula (3):

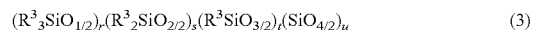
$(R^3{}_3SiO_{1/2})_r(R^3{}_2SiO_{2/2})_s(R^3SiO_{3/2})_t(SiO_{4/2})_u$ (3)

wherein $R^3$ is, independently at each occurrence, a group selected from a substituted or unsubstituted saturated hydrocarbon group of 1 to 12 carbon atoms, a substituted or unsubstituted aromatic hydrocarbon group of 6 to 12 carbon atoms, an alkenyl group of 2 to 10 carbon atoms, an alkoxy group of 1 to 10 carbon atoms bonded to a silicon atom, and a hydroxy group, wherein at least two of the $R^3$ groups are an alkenyl group, $r$ is an integer of 0 to 100, $s$ is an integer of 0 to 300, $t$ is an integer of 0 to 200, $u$ is an integer of 0 to 200, $1 \le t+u \le 400$, and $2 \le r+s+t+u \le 800$, in an amount of 10 to 10,000 parts by mass, relative to 100 parts by mass of component (A).

3. The addition-curable silicone resin composition of claim 1, wherein said component (A) is a branched organopolysiloxane.

4. The addition-curable silicone resin composition of claim 1, wherein said component (A) has at least one aromatic hydrocarbon group bonded to a silicon atom, wherein a percentage of the number of the aromatic hydrocarbon groups each bonded to a silicon atom, relative to the total number of all substituents each bonded to a silicon atom and present in component (A), is from 3% to 90%.

5. A semiconductor device comprising a cured product of the addition-curable silicone resin composition of claim 1.

6. The semiconductor device of claim 5, comprising a semiconductor element encapsulated with said cured product.

7. The semiconductor device of claim 6, wherein the semiconductor element is a light emitting element.

* * * * *